United States Patent [19]
Braceras et al.

[11] Patent Number: 5,715,198
[45] Date of Patent: Feb. 3, 1998

[54] OUTPUT LATCHING CIRCUIT FOR STATIC MEMORY DEVICES

[75] Inventors: George M. Braceras, Colchester; Donald A. Evans, Williston, both of Vt.

[73] Assignee: International Business Machines Corporation, Armonk, N.Y.

[21] Appl. No.: 792,030

[22] Filed: Feb. 3, 1997

[51] Int. Cl.⁶ .................................................. G11C 7/00
[52] U.S. Cl. ...................... 365/189.05; 365/190; 365/233
[58] Field of Search .......................... 365/189.05, 233, 365/194, 190, 230.08; 327/57

[56] References Cited

U.S. PATENT DOCUMENTS

| | | | |
|---|---|---|---|
| 5,163,023 | 11/1992 | Ferris et al. | |
| 5,216,289 | 6/1993 | Hahn et al. | |
| 5,239,506 | 8/1993 | Dachtera et al. | |
| 5,278,790 | 1/1994 | Kanabara | |
| 5,287,527 | 2/1994 | Delp et al. | |
| 5,535,171 | 7/1996 | Kim et al. | 365/233 |
| 5,539,696 | 7/1996 | Patel | 365/189.05 X |
| 5,563,835 | 10/1996 | Oldham | |
| 5,604,701 | 2/1997 | Alexander et al. | 365/189.05 X |
| 5,606,526 | 2/1997 | Pilo | 365/189.05 |

*Primary Examiner*—David C. Nelms
*Assistant Examiner*—Huan Hoang
*Attorney, Agent, or Firm*—Whitham, Curtis, Whitham & McGinn; Robert A. Walsh

[57] ABSTRACT

An output latching circuit for low power static memory devices guarantees glitch-free operation and high performance. The output latching circuit uses first and second latches respectively connected to receive true and complement pulses from the memory array. Third and fourth latches are respectively connected to outputs of the first and second latches. A pull up device is connected to be controlled by an output of the third latch, and a pull down device is connected to be controlled by an output of the fourth latch. The pull up device and the pull down device are connected in series between first and second voltage sources, and an output is connected to a junction of the pull up and pull down devices. An output control receives a clock input and provides a delayed clock output to the third and fourth latches to transfer data latched in the first and second latches to the third and fourth latches, respectively. A tristate input is connected to reset each of the first, second, third and fourth latches to provide a high impedance state at the output. A strobe input may optionally be connected to reset the first and second latches. In this case, the strobe input pulses just prior to new data arrival from the memory array, resetting the first and second latches and causing a momentary high impedance state to occur.

2 Claims, 3 Drawing Sheets

OUTPUT LATCHING CIRCUIT FOR STATIC MEMORY DEVICES

BACKGROUND OF THE INVENTION

1. Field of the Invention

The present invention generally relates to computer memory devices and, more particularly, to an output latching circuit which guarantees glitch-free and race-free operation with high performance memory arrays.

2. Background Description

Static random access memory (SRAM) devices fabricated using complementary metal oxide semiconductor (CMOS) technology use dynamic, self resetting circuits for high performance. Low-signal swing and static circuits are required for lower power memory devices. Memory devices typically employ a bidirectional data bus for writing data to the memory array and reading data from the memory array. As a result, the off-chip drivers of the memory device are required to function in a high-impedance state, as well as driving a high or low voltage off-chip. Such off-chip drivers are commonly referred to as tristate drivers due to their third, high impedance state. During the high impedance state of the off-chip drivers, another device such as the central processing unit (CPU) can drive the data bus to write data to the memory device.

In high speed applications, it is important that data bus glitches be avoided. Glitches are momentary transitions to an invalid state. Data output circuitry takes the form of a data output register followed by the off-chip driver. If the off-chip driver is brought out of the high impedance state prior to new data arrival, the previous data is momentarily driven onto the bus, resulting in a glitch until the new data arrives.

SUMMARY OF THE INVENTION

It is therefore an object of the present invention to provide circuitry that eliminates glitches of previous data coming out of the high impedance state and does so without the use of dummy timing paths or race conditions.

It is another object of the invention to provide an output latching circuit for static memory devices which guarantees glitch-free and race-free operation and high performance.

According to the invention, there is provided a driver circuit coupled between an asynchronous data signal and an output driver with means to reset the outputs of the driver circuit and the output driver to allow a data signal to asynchronously propagate to an output terminal. The output latching circuit uses first and second latches respectively connected to receive true and complement pulses from the memory array. Third and fourth latches are respectively connected to outputs of the first and second latches. A pull up device is connected to be controlled by an output of the third latch, and a pull down device is connected to be controlled by an output of the fourth latch. The pull up device and the pull down device are connected in series between first and second voltage sources, and an output is connected to a junction of the pull up and pull down devices. An output control receives a clock input and provides a delayed clock output to the third and fourth latches to transfer data latched in the first and second latches to the third and fourth latches, respectively. A tri-state input is connected to reset each of the first, second, third and fourth latches to provide a high impedance state at the output. A strobe input may optionally be connected to reset the first and second latches. In this case, the strobe input pulses just prior to new data arrival from the memory array, resetting the first and second latches and causing a momentary high impedance state to occur.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
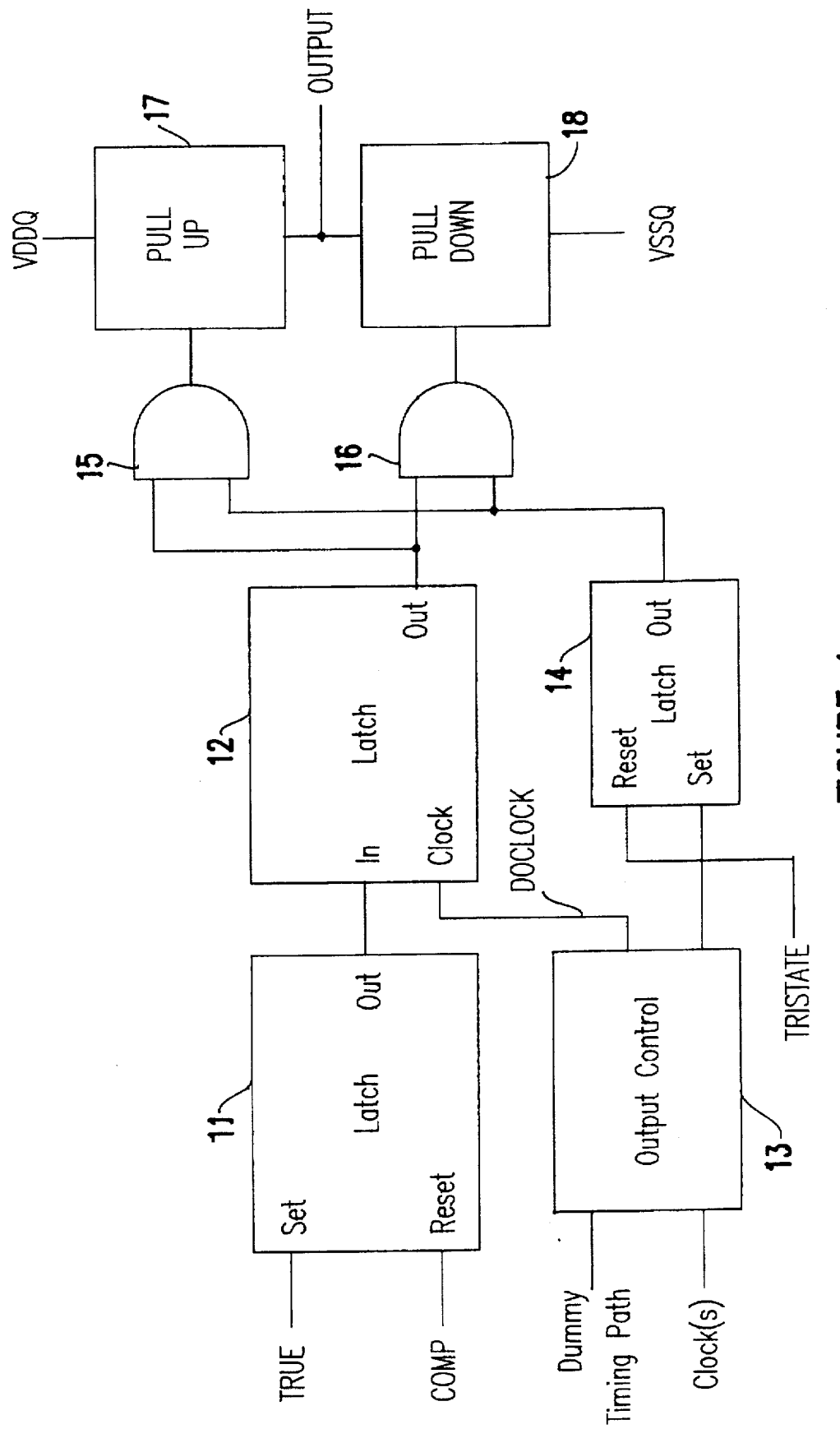
FIG. 1 is a block diagram of a prior art output latching circuit.

Referring now to the drawings, and more particularly to FIG. 1, there is shown the prior art approach for providing a glitch free output from a random access memory. A first latch 11 is connected to receive the true and complement outputs from the memory array. The output of the latch 11 is connected to an input of a second latch 12 which is controlled by a DOCLOCK signal from an output control circuit 13. The output control circuit receives an input from a dummy timing path and a clock input and provides outputs to the latch 12 and a third latch 14. The latch 14 is set by the output of the output control 13 and reset by a TRISTATE signal. The output of latch 12 is connected to each of two AND gates 15 and 16 which are enabled by the output of latch 14. AND gate 15 is connected to a pull up device 17, such as a p-type field effect transistor (PFET), and AND gate 16 is connected to a pull down device 18, such as an n-type FET (NFET). The pull up device 17 and the pull down device 18 are connected in series between voltage sources VDDQ and VSSQ, and the output is taken from the junction between the two devices 17 and 18.

Latch 11 receives data from the memory array in the form of precharged, differential true (TRUE) and complement (COMP) pulses. If TRUE pulses, then the output of latch 11 goes high. If COMP pulses, then the output of latch 11 goes low. Output control 13 controls when data is allowed to be passed from latch 11 to latch 12 and also when to allow latch 14 to be set. The clock input to output control 13 is used to control data output hold time. The dummy timing path input to output control 13 is used to assure that new data has been loaded into latch 11. The dummy timing path is designed to pulse after new data has arrived. This allows the output control 13 to load latch 12 with the new data in latch 11 and to set latch 14. Setting latch 14 allows AND gates 15 and 16 to pass the newly loaded data in latch 12 through to the output drive pull up device 17 and pull down device 18. If the output of latch 12 is high and latch 14 is set, the pull up device 17 will be active. If the output of latch 12 is low and latch 14 is set, the pull down device 18 will be active. If input TRISTATE is pulsed, latch 14 will be reset which causes AND gates 15 and 16 to disable both the pull up and pull down devices 17 and 18, thus placing the output in the high impedance state. The output stays in the high impedance state as long as latch 14 is reset.

Because this approach uses a dummy timing path to assure new data has arrived in latch 11, care must be exercised that the dummy timing path tracks with the data path delay across process variations. If the dummy timing path is too fast, then latch 14 could be set prior to new data arriving in latch 12 in which case old data would be glitched onto the bus. If the dummy timing path is too slow, then performance is degraded. In any event, timing margins must be added to account for the cross-chip process variations to reliably prevent a glitch in the output.

Figure 2:
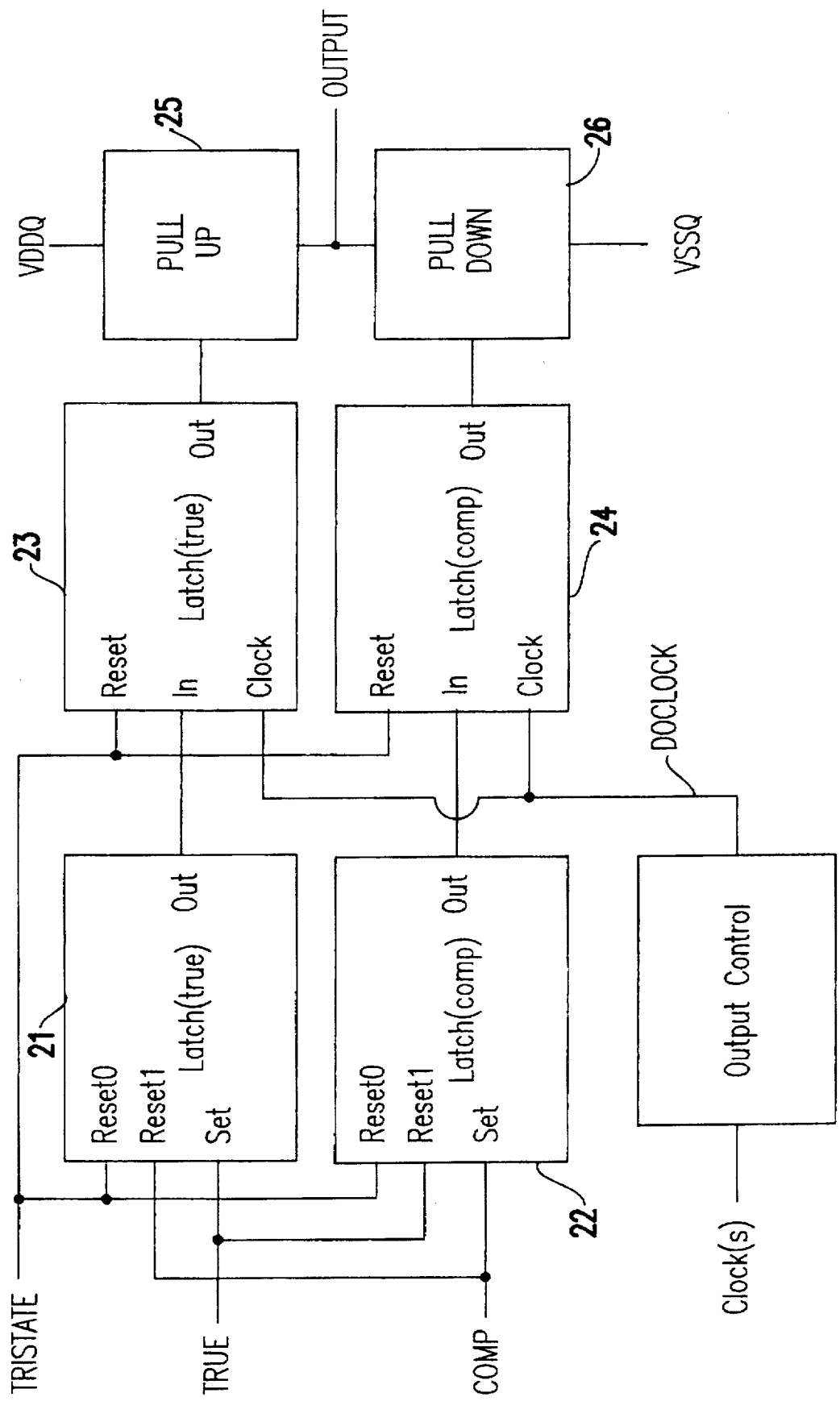
FIG. 2 is a block diagram of the output latching circuit according to the present invention.

The new approach according to the invention shown in FIG. 2 is to have one latch for the true data and a separate latch for the complement data. Thus, the true data is latched by the latch 21 and the complement of the data is latched by the latch 22. The outputs of the latches 21 and 22 are connected to latch 23, for true data, and latch 24, for complement data, respectively. The output of latch 23 is connected to a pull up device 25, and the output of latch 24 is connected to a pull down device 26. The pull up device 25 and the pull down device 26 are connected in series between voltage sources VDDQ and VSSQ, and the output is taken from the junction between the two devices 25 and 26, as in the circuit of FIG. 1.

Using separate latches for the true and complement data paths, if signal TRUE pulses, then latch 21 is set and latch 22 is reset. If signal COMP pulses, then latch 22 is set and latch 21 is reset. If the data output hold time has been met, then DOCLK is high and the data is passed from latches 21 and 22 to latches 23 and 24, respectively. To place the output in the high impedance state, signal TRISTATE pulses which resets latches 21, 22, 23, and 24. By design, the output remains in the high impedance state until new data arrives. This guarantees glitch free operation without requiring a dummy timing path.

Figure 3:
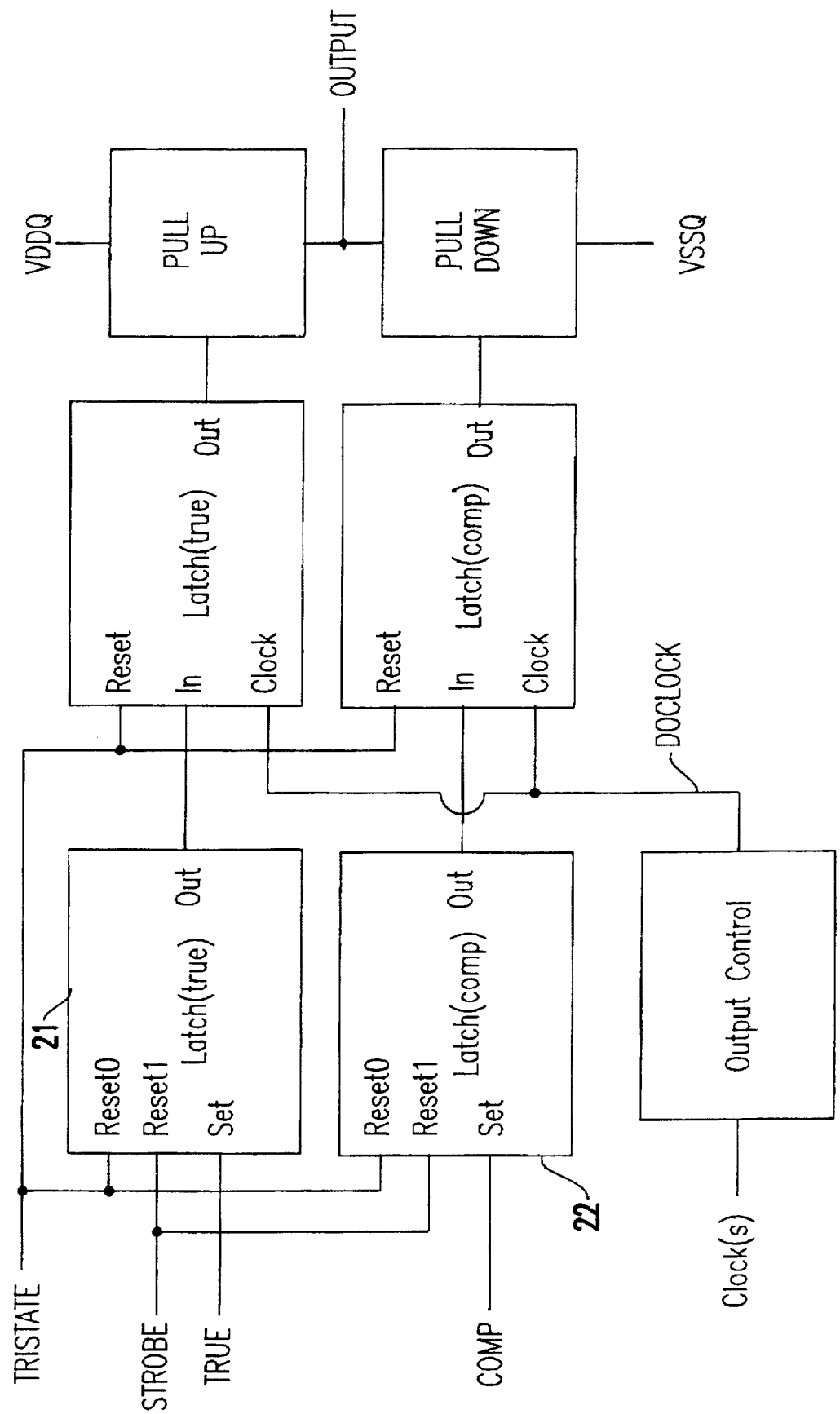
FIG. 3 is a block diagram of another embodiment of the present invention.

FIG. 3 shows a further embodiment of the invention where the RESET1 input of latches 21 and 22 are connected to input STROBE. The STROBE signal is designed to pulse just prior to new data arrival, thus resetting both latches 21 and 22 causing a momentary high impedance to occur. The new data then arrives setting either latch 21 or latch 22, depending on which input, TRUE or COMP, pulses. This embodiment reduces the load in inputs TRUE and COMP, allows the delay through the latches to be skewed toward setting since the STROBE gives the reset paths an early start, and also reduces shoot-through current from VDDQ to VSSQ between data transitions because of the momentary high impedance state between transitions.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. An output latching circuit for a memory device to provide glitch-free and race-free output comprising:

first and second latches respectively connected to receive true and complement pulses from a memory array;

third and fourth latches respectively connected to outputs of the first and second latches;

a pull up device connected to be controlled by an output of the third latch;

a pull down device connected to be controlled by an output of the fourth latch, the pull up device and the pull down device being connected in series between first and second voltage sources and an output being connected to a junction of the pull up and pull down devices;

an output control receiving a clock input and providing a delayed clock output to the third and fourth latches to transfer data latched in the first and second latches to the third and fourth latches, respectively; and a tri-state input connected to reset each of the first, second, third and fourth latches to provide a high impedance state at the output.

2. The output latching circuit for a memory device recited in claim 1 further comprising a strobe input connected to reset the first and second latches, the strobe input pulsing just prior to new data arrival from the memory array resetting the first and second latches and causing a momentary high impedance state to occur, thereby reducing a load in the inputs and allowing a delay through the latches to be skewed toward setting.

* * * * *